United States Patent [19]
Nishibayashi et al.

[11] Patent Number: 5,757,032
[45] Date of Patent: May 26, 1998

[54] SEMICONDUCTOR DIAMOND DEVICE HAVING IMPROVED METAL-DIAMOND CONTACT FOR EXCELLENT OPERATING STABILITY AT ELEVATED TEMPERATURE

[75] Inventors: Yoshiki Nishibayashi; Hiromu Shiomi; Shin-ichi Shikata, all of Itami, Japan

[73] Assignee: Sumitomo Electric Industries Ltd., Japan

[21] Appl. No.: 510,220

[22] Filed: Aug. 2, 1995

[30] Foreign Application Priority Data

Aug. 17, 1994 [JP] Japan ................. 6-193239

[51] Int. Cl.[6] ............. H01L 31/0312; H01L 27/095; H01L 23/48; H01L 23/52
[52] U.S. Cl. ............. 257/77; 257/486; 257/761; 257/763
[58] Field of Search .......... 257/77, 471, 472, 257/473, 485, 486, 750, 761, 763, 770

[56] References Cited

U.S. PATENT DOCUMENTS 4,982,243  1/1991  Nakahata et al. ............. 257/77
5,002,899  3/1991  Geis et al. ................... 257/77
5,436,505  7/1995  Hayashi et al. ............... 257/77

FOREIGN PATENT DOCUMENTS

| 0 390 209 | 10/1990 | European Pat. Off. ....... 257/77 |
| 0 406 882 | 1/1991 | European Pat. Off. ....... 257/77 |
| 0 588 260 | 3/1994 | European Pat. Off. ....... 257/77 |
| 1-246867 | 10/1989 | Japan ........................ 257/77 |
| 3-58480 | 3/1991 | Japan ........................ 257/77 |
| 3-58481 | 3/1991 | Japan ........................ 257/77 |
| 4-26161 | 1/1992 | Japan ........................ 257/77 |

*Primary Examiner*—Steven H. Loke
*Attorney, Agent, or Firm*—Pennie & Edmonds LLP

[57] ABSTRACT

A semiconductor device comprising an electrode formed on a semiconductor diamond. The electrode includes a first metal section which is in contact with a surface of the semiconductor diamond and which has a thickness of 100 nm or smaller, and further including a second metal section which is in contact with the first metal section and which has a thickness of equal to or larger than four times the thickness of the first metal section. The second metal section is made of a metal having a melting point of 1000° C. or higher.

13 Claims, 1 Drawing Sheet

SEMICONDUCTOR DIAMOND DEVICE HAVING IMPROVED METAL-DIAMOND CONTACT FOR EXCELLENT OPERATING STABILITY AT ELEVATED TEMPERATURE

BACKGROUND OF THE INVENTION

1. Field of the Invention

The present invention relates to a semiconductor device. The present invention is directed to a semiconductor device having a metal-diamond contact with improved heat resistance.

2. Related Background Art

Diamond is one of typical materials of wide band gap material. Various studies have been made on semiconductor devices with a diamond, including study on improvement of heat resistance, which recently become important. The diamond semiconductor devices are expected to be used under severe thermal conditions. For example, the semiconductor devices for the use in applications such as automotive engine rooms and satellites must be stable in operating at the temperatures of at least 600° C. Thus, excellent heat resistance is required for both the semiconductor materials (diamond) and the electrode materials (typically, metals). In making a Schottky contact for a p-type semiconductor diamond or an Ohmic contact for an n-type semiconductor diamond, material is selected for forming electrode so that its barrier against the diamond at the contact is enhanced. Such materials are typically Al and Mg, melting point of which are low, and, thus, there have been difficulties in improving the thermal resistance of diamond semiconductor devices using metals having low melting point.

In addition, a natural diamond is usually used for diamond semiconductor devices with satisfactory heat resistance rather than a vapor phase synthetic diamond. This is because the surface of the natural diamond that is in contact with a metal is more smooth than the surface of the synthetic diamond.

It is, therefore, desirable to provide a semiconductor device for the use in the elevated temperature, which includes a thermal resistance improved electrode.

It is also desirable to provide a diamond semiconductor device having a Schottky contact with an excellent thermal resistance.

SUMMARY OF THE INVENTION

A semiconductor device according to the present invention comprises:

a) a semiconductor diamond; and b) an electrode including a first metal section or layer which is in contact with a surface of the semiconductor diamond and which has a thickness of 100 nm or less, and a second metal section or layer which is in contact with the first metal section and which has a thickness of equal to or greater than four times the thickness of the first metal section, wherein the second metallic section consists of a metal, melting point of which is 1,000° C. or higher.

Excellent operating stability at elevated temperature is achieved with the semiconductor device according to the present invention.

The first metal section of the electrode is extremely thin. When the first metal section is formed to be extremely thin, a different physical and a different electrical properties of the metal consisting of the first section would appear, and, in particular, the softening temperature of the first metal section increases. Further, the thin first metal section in contact with the diamond is protected by the second metal section consisting of a high-melting point metal. The high-melting point metal for second metal section is typically a refractory metal such as W, Zr and Ta. While a low-melting point metal is used for creating Schottky contact with diamond, the thermal resistance of the entire electrode is significantly improved.

When the first metal section consists of a metal having a work function of equal to 5.0 eV or less, the barrier between the diamond and the first metal section increases, resulting in the Schottky contact or Ohmic contact.

Further advantage is provided when the metal (Me) having following thermodynamic relationship with a carbon (C) and a chemical compound (MeC) of the metal and carbon is used for the first metal section:

$$G_{Me} + G_C - 10 \text{ (kcal/mol)} \geq G_{MeC},$$

where $G_{Me}$ is the Gibbs energy of the metal Me, $G_C$ is the Gibbs energy of the carbon C and $G_{MeC}$ is the Gibbs energy of the compound MeC. The relationship is obtained at a constant temperature and under a constant pressure.

The thermodynamic relationship means that the atom of the metal of the first metal section less or not react with the carbon atom on the diamond surface at the contacts under the elevated temperature. Thus the interface between the diamond and the metal is chemically stable under a high temperature condition, thereby improving the thermal stability of the device in view of chemical stability. Examples of such metals typically are Al, Mg and Zn.

Schottky contact with an excellent thermal resistance is created onto the p-type semiconductor diamond surface with the electrode which comprises two metal sections described above.

Further, the semiconductor device of the present invention can be manufactured with higher productivity by using synthetic diamond film.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
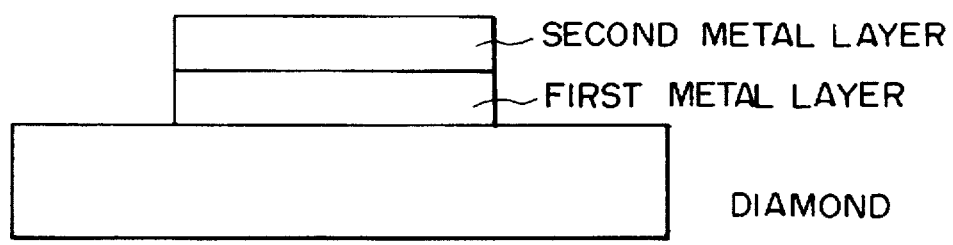
FIG. 1 is a cross-sectional view showing a semiconductor device according to the present invention.

Different characteristics from its original characteristics is obtained when the metal is formed into an extremely thin film for fabrication of an electrode. In addition, when an electrode of a multilayer structure comprising a combination of the thin film of the metal and a refractory metal is used, the entire device including electrode become thermodynamically stable. By using these features, a metal-diamond contact according to the present invention provides a Schottky contact with an excellent heat resistance when a p-type semiconductor diamond and an adequate metal for electrode are used. When an n-type semiconductor diamond is used, the metal-diamond contact serves as an Ohmic electrode with excellent thermal resistance. In particular, a thermally improved electrode is formed on a synthetic diamond, so that synthetic diamond semiconductor device according to the present invention acquires an improved heat resistance.

Detailed description of the present invention shall further be made hereinbelow.

[Diamond]

The diamond used in the present invention may be any one of an synthetic bulk single crystal diamond, a thin-film polycrystalline diamond obtained by using a vapor phase synthesis, and a thin-film single crystal (epitaxial film) diamond obtained via vapor phase deposition. Other synthesis than vapor phase deposition may be employed to form diamond layer used in the present invention. In addition, a synthetic semiconductor diamond may be obtained by means of, but not limited to, hydration of diamond, doping impurities into diamond, or applying a lattice defect into diamond. Natural diamond can also be used for the device of the present invention.

Variety of synthesis methods can be used for forming undoped or doped diamond for the present invention. Typical manufacturing methods for semiconductor device according to the present invention may comprise one of the following processing steps:

(1) applying a direct-current or alternating-current electrical field to activate a raw material gas;

(2) heating a thermoionic emission material to activate a raw material gas;

(3) hitting a diamond-growing surface with ions;

(4) exciting a raw material gas by light such as a laser beam and an ultraviolet radiation; and (5) burning a raw material gas.

In order to give excellent electrical properties to a semiconductor device, the resistivity of the semiconductor diamond is preferably equal to or less than $1 \times 10^5$ Ω.cm, more preferably not higher than 1,000 Ω.cm, the most preferably not higher than 100 Ω.cm.

The chemical vapor deposition (CVD) process is preferably used for depositing doped diamond with an n-type dopant (e.g., nitrogen) or p-type dopant (e.g., boron), since CVD is suitable for precisely controlling dopant levels into diamond.

[Electrode]

An electrode according to the present invention may consist of a multilayer structure including two or more metal layers. As shown in the cross sectional view of FIG. 1, the multilayer structure (bilayer structure in FIG. 1) preferably comprises a plurality of layers including a thin fist metal layer made of a first metal and a thick second metal layer made of a second metal. Alternatively, the composite structure may further be annealed. The barrier heights of metal-semiconductor systems are, in general, determined by both metal work function and the surface state. Larger barrier height at the metal-diamond contact is obtained when a metal having a work function of equal to or smaller than 5 eV is used for the first metal layer. The work function values of various species are shown in, for example, S. M. Sze, "Physics of Semiconductor Devices" (Second Edition), John Wiley & Sons, New York, N.Y. (1981), page 251, the disclosure of which is hereby incorporated by reference. Aluminum (Al), magnesium (Mg), and zinc (Zn) are typically the metal having a work function of equal to or smaller than 5 eV for preferably used for the first metal section.

It is more preferable that the first metal section consists of a metal having a work function of from 2.5 eV to 4.5 eV to provide higher barrier heights. Even if the metal of the first metal section has relatively low melting point of 700° C. or lower, a semiconductor device with an excellent heat resistance can also be obtained.

A metal having a high melting point of 1,000° C. or higher is used for the second metal section. Examples of the high-melting-point metal include tungsten (W), zirconium (Zr), tantalum (Ta), molybdenum (Mo), and niobium (Nb).

It is preferable that the thickness (t1) of the first metal section in contact with the diamond surface is 0.5 nm or larger, more preferably, not larger than 100 nm and most preferably not larger than 50 nm. The melting point of the thinner first metal section is higher than ordinary state, when the thickness is significantly small.

The first metal section is in contact with the second metal section made of a metal having a melting point of 1,000° C. or higher. More preferably, the entire surface of the first metal section is covered with the second metal section, so that melting of the first metal layer at a high temperature is avoided. The thickness (t2) of this second metal section is desired to be larger than the thickness (t1) of the foregoing first metal section, i.e., (t2>t1). It is preferable that the thickness (t2) of the second metal section is 10 nm or larger (more preferably, approximately 30 to 200 nm). The ratio (t2/t1) of the thickness t2 of the second metal section to the thickness (t1) of the first metal section is preferable to be 4 or more (more preferably, approximately 10 to 50).

It must be avoided for a part of the first metal section to be fused together with the second metal. In other words, it is not permitted that the high melting point-metal (second metal section or) diffuses into the first metal section to directly come into contact with the diamond, and it is not permitted that the metal of a part of the first metal section diffuses into the second metal section. Thus, a combination of metals for the first and the second metal sections may be selected so that the first metal react with the second metal at these interface to form metal-metal compound, thereby the interface of the first and the second metal sections become thermodynamically stable. The metal-metal compound is produced, and further reaction or diffusion under the elevated temperature is inhibited. Following combinations are used to provide metal-metal compound at the interface of the first and the second metal sections:

| Second Metal Section | First Metal Section |
| --- | --- |
| W | Al |
| W | Mg |
| Zr | Al |
| Zr | Mg |
| Zr | Zn |
| W | Zn |
| Ta | Al |
| Ta | Mg |
| Ta | Zn |
| Ta | Pb |
| W | Pb |
| Zr | Pb |

It is preferable to use the vapor deposition for a process of forming an electrode. Examples of the vapor deposition may be vacuum evaporation, ionic plating, sputtering, CVD, or plasma CVD.

[Annealing]

In the present invention, annealing of the device may be carried out if necessary. The annealing may be preferable for improving and stabilizing electronic and mechanical properties of the electrode. The annealing may be, but not limited to, furnace annealing, electron beam annealing, laser annealing, and infrared lamp annealing. In the case of the furnace annealing, it is desired that the annealing is made at a temperature of from about 300° C. to about 1000° C., more preferably about 400° C. to about 800° C., for a time period of about 5 seconds—about 10 minutes (more preferably, about 30 seconds—about 5 minutes) in an atmosphere of $H_2$ or $N_2$.

More detailed description of the present invention will be made hereinbelow concerning a set of examples.

EXAMPLE 1

According to the present invention, the first metal section made of Al and the second metal section made of W were formed on a boron-doped synthetic diamond to provide a Schottky electrode thereon to fabricate a diode. Different diodes were produced with varying the ratio of the thickness of the first and second metal sections changed. Thermal resistance of the diodes were evaluated.

On an Ib-type single crystal diamond substrate made through the high-pressure synthesis, a boron-doped layer 2 and a boron-doped layer 1 were successively formed by the microwave plasma CVD under the conditions set forth in Table 1 below. In this event, the amount of the boron doped into the layer 1 was larger than the doping amount into the layer 2. The resultant boron-doped diamond is a p-type semiconductor.

TABLE 1

| PROCESS CONDITIONS FOR DEPOSITING BORON-DOPED DIAMOND LAYERS. | | |
| --- | --- | --- |
| boron-doped layers | layer 1 | layer 2 |
| H2 flow rate | 200 sccm | 200 sccm |
| CH4 flow rate | 1 sccm | 1 sccm |
| diboran flow rate (H2 diluted, 10 ppm) | 2 sccm | 1 sccm |
| microwave power | 400 W | 400 W |
| pressure | 40 Torr | 40 Torr |

Subsequently, as diagrammatically shown in a cross section of FIG. 2, the boron-doped layer was processed by photolithography and etching. The etching conditions are as follows:

| Etching Conditions | |
| --- | --- |
| Etching Gas: $O_2$, Volumetric Flow Rate ($O_2$/Ar): 1% RF Power: 300 W Pressure: 20 mTorr Etching Time: 90 min. | Carrier Gas: Ar |

Al and W films were formed in this order through photolithography and sputtering. Formed on the boron-doped layer 1 etched was a heat-resistant Schottky electrode comprising a laminated structure of Al and W films (in this order from the boron-doped layer 2) and having a size of 40 μm to 200 μm in diameter. On the other hand, similarly formed on the boron-doped layer 1 was a heat-resistant Ohmic electrode (size: 200 μm×1000 μm) comprising a laminated structure of Ti (metal for the Ohmic electrode), Mo, and Au (in this order from the boron-doped layer 1), thereby forming the diode structure as shown in FIG. 1. For the formation of this electrode, the respective thicknesses of the Al and W films were changed as shown in Table 2. A rectification rate of the diodes so produced was measured immediately after the formation of the diode. In addition, for evaluating the heat resistance of the electrodes, a head test was made for a long time (500° C., 10 hours) after the formation of the diodes, before measuring the rectification rates. The results are shown in Table 2.

TABLE 2

THE RECTIFICATION RATES OF DIFFERENT DIODES WITH DIFFERENT ELECTRODE CONSTITUTIONS BY VARYING THICKNESS RATIO OF THE FIRST AND THE SECOND METAL SECTION.
first metal sections consist of Al:
second metal sections consist of W.

| electrode {W(nm)/Al(nm)} | rectification rate before heating | rectification rate after 10 hrs heating at 500° C. |
| --- | --- | --- |
| No.1 {50 nm/5 nm} | $1 \times 10^6$ | $1 \times 10^5$ |
| No.2 {100 nm/5 nm} | $1 \times 10^6$ | $2 \times 10^5$ |
| No.3 {200 nm/5 nm} | $2 \times 10^6$ | $3 \times 10^5$ |
| No.4 {200 nm/10 nm} | $2 \times 10^6$ | $3 \times 10^5$ |
| No.5 {200 nm/50 nm} | $1 \times 10^6$ | $1 \times 10^5$ |
| No.6 {200 nm/100 nm} | $1 \times 10^6$ | $3 \times 10^4$ |
| No.7 {0 nm/100 nm} | $1 \times 10^6$ | $1 \times 10^2$ |
| No.8 {100 nm/0 nm} | $1 \times 10^4$ | $1 \times 10^3$ |

For obtaining the rectification rates, the voltages of 10V and -10V were respectively applied thereto in the air under the condition of the room temperature to obtain the ratio of the forward current and inverse current.

As shown in Table 2, in the case of a diode (No. 7) in which only the Al electrode was formed on the boron-doped layer 2, the rectification rate of the Schottky electrode after the heat test was significantly decreased as compared with the rectification rate before the heat test. This means that the diode in which only the Al electrode is formed as the Schottky electrode on the boron-doped layer 2 is difficult to be used in a high-temperature environment. Further, a diode (No. 8) having the W electrode alone was unsatisfactory in the rectification rate.

On the other hand, in the case of diodes (Nos. 1 to 5) having a Schottky electrode made by forming an Al film with a thickness of 5 nm to 50 nm on the boron-doped layer 2 and by further forming on the Al film a W film having a thickness four times or more the thickness of the Al film, the rectification rate after the annealing was not decreased significantly as compared with the rectification rate before the annealing. This means that the electrode with the W/Al structure exhibited an extremely excellent heat resistance. However, in the case of a diode (No. 6) having an electrode in which the thickness of the W film is two times the thickness of the Al film, the rectification rate after the heating was decreased.

EXAMPLE 2

Figure 2:
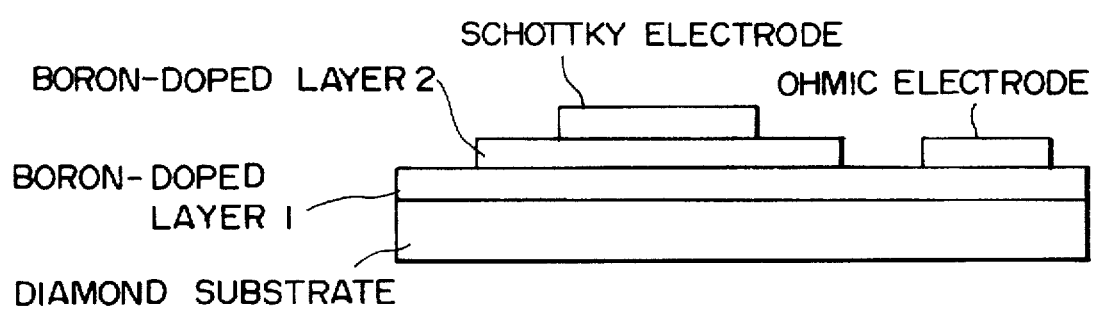
FIG. 2 is a cross-sectional view showing another semiconductor device according to the present invention.

Example 1 was repeated except that the Schottky electrode was made with a laminated structure comprising an Mg film and a W film to form, a boron-doped layer 1, a boron-doped layer 2, a Schottky electrode and an Ohmic electrode successively in this order on a diamond substrate to form a diode as shown in FIG. 2. Further, a different diodes were formed with varying thicknesses of the Mg and W layers as shown in Table 3. The rectification rates of the diodes were measured immediately after the fabrication and after the heating test (500° C., 10 hours). The results are shown in Table 3.

TABLE 3

THE RECTIFICATION RATES OF DIFFERENT DIODES WITH DIFFERENT ELECTRODE CONSTITUTIONS BY VARYING THICKNESS RATIO OF THE FIRST AND THE SECOND METAL SECTION.
first metal sections consist of Mg: second metal sections consist of W.

| electrode {W(nm)/Mg(nm)} | rectification rate before heating | rectification rate after 10 hrs heating at 500° C. |
| --- | --- | --- |
| No.9 {50 nm/5 nm} | $0.5 \times 10^6$ | $1 \times 10^5$ |
| No.10 {100 nm/5 nm} | $0.5 \times 10^6$ | $1 \times 10^5$ |
| No.11 {200 nm/5 nm} | $1 \times 10^6$ | $2 \times 10^5$ |
| No.12 {200 nm/10 nm} | $2 \times 10^6$ | $6 \times 10^5$ |
| No.13 {200 nm/50 nm} | $2 \times 10^6$ | $3 \times 10^5$ |
| No.14 {200 nm/100 nm} | $2 \times 10^6$ | $6 \times 10^4$ |
| No.15 {0 nm/100 nm} | $2 \times 10^6$ | $1 \times 10$ |
| No.8 {100 nm/0 nm} | $1 \times 10^4$ | $1 \times 10^3$ |

In the case of a diode (No. 15) in which the Mg electrode alone was formed on the boron-doped diamond layer, the rectification rate after the heat test was significantly decreased as compared to that before the heat test. On the other hand, in the case of diodes (Nos. 9 to 13) in which the Mg film was formed to have a thickness of approximately 5 nm to 100 nm and the W film was formed thereon to have a thickness four times or more the thickness of the Mg film, the rectification rate after the heat test was decreased significantly as compared with that before the heat test. That is, a diode made with a W/Mg film structure having such a thickness ratio exhibit an extremely excellent heat resistance.

EXAMPLE 3

Example 1 was repeated to produce a diode shown in FIG. 2 except that a metal selected from the group consisting of Al, Mg and Zn was used as the metal (first metal section) in contact with the boron-doped diamond layer 2, and a metal selected from the group consisting of W, Ta, Mo, Nb and Zr was used as the high-melting-point metal (second metal section). For the formation of the electrode, the combination of the metals for the first and second metal sections was changed as shown in Table 4 to evaluate the deterioration of the rectification rate after the heat test as in the Examples 1 and 2. Independent to this, an electrode made of one of Al, Mg and Zn was formed on a diamond to fabricate a diode, which in turn, was subjected to the measurement in terms of the rectification rate after the heat test. These metals are known to individually provide a Schottky contact at the contact with the diamond. Table 4 indicates the results of the measurement.

TABLE 4

RECTIFICATION RATE OF THE DIFFERENT DIODES WITH DIFFERENT ELECTRODE CONSTITUTIONS AFTER HEATING

| Electrode constitution {2nd metal/1st metal} | Rectification rate after 10 hr heating at 500° C. | Rectification rate using electrode of single 1st metal after 10 hr heating at 500° C. |
| --- | --- | --- |
| No. 16 {W/Zn} | $0.3 \times 10^5$ | 10 (Zn) |
| No. 17 {Ta/Al} | $1 \times 10^5$ | 100 (Al) |

TABLE 4-continued

RECTIFICATION RATE OF THE DIFFERENT DIODES WITH DIFFERENT ELECTRODE CONSTITUTIONS AFTER HEATING

| Electrode constitution {2nd metal/1st metal} | Rectification rate after 10 hr heating at 500° C. | Rectification rate using electrode of single 1st metal after 10 hr heating at 500° C. |
| --- | --- | --- |
| No. 18 {Ta/Mg} | $3 \times 10^5$ | 20 (Mg) |
| No. 19 {Ta/Zn} | $0.3 \times 10^5$ | 10 (Zn) |
| No. 20 {Mo/Al} | $1 \times 10^5$ | 100 (Al) |
| No. 21 {Mo/Mg} | $4 \times 10^5$ | 20 (Mg) |
| No. 22 {Mo/Zn} | $0.3 \times 10^5$ | 10 (Zn) |
| No. 23 {Nb/Al} | $1 \times 10^5$ | 100 (Al) |
| No. 24 {Nb/Mg} | $2 \times 10^5$ | 20 (Mg) |
| No. 25 {Nb/Zn} | $0.3 \times 10^5$ | 10 (Zn) |
| No. 26 {Zr/Al} | $1 \times 10^5$ | 100 (Al) |
| No. 27 {Zr/Mg} | $2 \times 10^5$ | 20 (Mg) |
| No. 28 {Zr/Zn} | $0.1 \times 10^5$ | 10 (Zn) |

*2nd metal layer:1st metal layer = 200 nm:50 nm

To compare with the rectification rates shown in Table 4, the rectification rates of single layer electrode of Zn, Al and Mg, respectively, after 10 hrs heating at 500° C. are shown;

rectification rate of an electrode consisting of Zn layer after 10 hrs heating at 500° C. is 10;

rectification rate of an electrode consisting of Al layer after 10 hrs heating at 500° C. is 100; and rectification rate of an electrode consisting of Mg layer after 10 hrs heating at 500° C. is 20.

As shown in Table 4, in the case of a diode provided with an electrode made of one of Al, Mg and Zn formed on a boron-doped diamond, the rectification rate of the Schottky electrode was significantly decreased and the heat resistance was deteriorated.

On the other hand, in the case of a diode having a Schottky electrode made with a first metal section formed on a boron-doped diamond and a second metal section made up of a high-melting-point metal formed thereon, the rectification rate was not deteriorated significantly even after the heat test. In particular, it has been found that the diode having the first metal section made of Al or Mg exhibited an excellent heat resistance.

Although in the Examples the heat resistance of the Schottky contact was evaluated in the diode configuration, it is obvious that FETs having similar electrodes may be fabricated. These FETs exhibit equivalent heat resistances as the aforementioned Examples.

EXAMPLE 4

Boron-doped layers 1 and 2 were deposited via microwave plasma CVD on the single crystal diamond substrate, and the electrodes were formed on the surface of the boron-doped layer, which had been already processed/treated before forming electrodes according to the pretreatment processes shown in Table 5.

The difference of the Example 4 from the Examples 1–3 is that the doped layer surface for electrodes to be deposited was processed/treated before forming electrodes in Example 4, while the doped layer surfaces of the Examples 1–3 were "as grown" and no treatment was made before forming electrodes.

As shown in Table 5, each of an annealing processing in oxygen atmosphere, an annealing processing in the air, an oxygen plasma processing and a hydrogen plasma processing was used for pre-treating doped diamond surface. The electrode consisting Al layer of the first metal section and W layer of the second metal section was formed onto the pre-treated surface. The rectification rate measurement was then carried out by same manner as in Example 1. The results are shown in Table 6.

TABLE 5

CONDITIONS FOR PRE-TREATING DOPED DIAMOND LAYER SURFACE.

| Pre-treating method | $O_2$ Air annealing | $O_2$ annealing | $H_2$ plasma | plasma |
|---|---|---|---|---|
| Atmosphere | 100% $O_2$ | air | 100% $O_2$ | 100% $H_2$ |
| Pressure | *atom. pressure | *atom. pressure | 20 mTorr | 40 Torr |
| Temperature | 450° C. | 450° C. | <50° C. | >800° C. |
| Duration | 10 min. | 10 min. | 2 min. | 5 min. |
| Power | — | — | 50 W RF | 200 W microwave |

*atom. pressure = atmospheric pressure

TABLE 6

RECTIFICATION RATES AFTER 10 HRS HEATING AT 500° C., BY PRE-TREATMENT METHODS.

| Electrode W(nm)/Al(nm) | *pre-treat.(1) | *pre-treat.(2) | *pre-treat.(3) | *pre-treat.(4) |
|---|---|---|---|---|
| 50 nm/5 nm | $5 \times 10^5$ | $6 \times 10^5$ | $5 \times 10^5$ | $2 \times 10^5$ |
| 100 nm/5 nm | $7 \times 10^5$ | $7 \times 10^5$ | $6 \times 10^5$ | $2 \times 10^5$ |
| 200 nm/5 nm | $8 \times 10^5$ | $6 \times 10^5$ | $6 \times 10^5$ | $3 \times 10^5$ |
| 200 nm/10 nm | $5 \times 10^5$ | $5 \times 10^5$ | $4 \times 10^5$ | $3 \times 10^5$ |

*Doped diamond surface was pre-treated for 10 hrs at 500° C. by:
pre-treat.(1) oxygen annealing;
pre-treat.(2) air annealing;
pre-treat.(3) oxygen plasma; and
pre-treat.(4) hydrogen plasma.

The excellent thermal resistance was obtained, according to the Table 6. In comparison with the rectification rates shown in the table 2 for diodes having W/Al electrode formed on the "as grown" surface, it is obvious that the rectification rates of the diodes including electrodes, which were formed on the pre-processed doped diamond surface via hydrogen plasma (4), are equivalent to diode having electrodes which was formed on "as grown" surface of the doped diamond. It is also found that, in comparison with the data of Table 2, the equivalent or superior rectification rates were obtained as shown in Table 6, when one of oxygen annealing (1), air annealing (2) and oxygen plasma processing (3) was used to pretreat the doped layer surface.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 193239/1994 (6-193239) filed on Aug. 17, 1994 is hereby incorporated by reference.

What is claimed is:

1. A semiconductor device comprising:
   a) an n-type semiconductor diamond; and
   b) an electrode including:
      (i) a first metal section, being in contact with a surface of said n-type semiconductor diamond, having a thickness of 100 nm or less, having a melting point of 700° C. or less, and having a work function of equal to or smaller than 5.0 eV; and
      (ii) a second metal section, being in contact with said first metal section and having a thickness of equal to or larger than four times the thickness of said first metal section, wherein said second metal section consists of a metal, melting point of which is equal to or higher than 1,000° C.

2. A semiconductor device according to claim 1, wherein said first metal section consists of a metal (Me), said metal (Me) having a thermodynamic relationship with carbon (C) and a compound (MeC) of said metal and carbon, at a constant temperature under a constant pressure, of:

$$G_{Me}+G_C-10 \text{ (kcal/mol)} \geq G_{MeC},$$

where $G_{Me}$ is a Gibbs energy of said metal (Me), $G_C$ is a Gibbs energy of carbon (C) and $G_{MeC}$ is a Gibbs energy of said compound (MeC).

3. A semiconductor device according to claim 2, wherein said metal of said first metal section is selected from the group consisting of aluminum (Al), magnesium (Mg), zinc (Zn) and lead (Pb).

4. A semiconductor device according to claim 2, wherein said metal of said second metal section is selected from the group consisting of tungsten (W), zirconium (Zr), tantalum (Ta), molybdenum (Mo), niobium (Nb).

5. A semiconductor device according to claim 2, wherein said first metal section has a thickness of 50 nm or smaller.

6. A semiconductor device according to claim 1, wherein said semiconductor diamond is a synthetic diamond.

7. A semiconductor device according to claim 6, wherein said semiconductor diamond is a diamond which is formed via chemical vapor deposition.

8. An FET which comprises the semiconductor device according to claim 1.

9. A diode which comprises the semiconductor device according to claim 1.

10. A semiconductor device comprising:
    a) a p-type semiconductor diamond; and
    b) an electrode including
       a first metal section which is in contact with a surface of said p-type semiconductor diamond and has a thickness of 100 nm or smaller, and
       a second metal section which is in contact with said first metal section and has a thickness of equal to or larger than four times the thickness of said first metal section, wherein said second metal section consists of a metal, melting point of which is 1,000° C. or higher, and wherein said p-type semiconductor diamond makes a Schottky contact with said first metal section of said electrode.

11. A semiconductor device according to claim 10, wherein said first metal section consists of a metal having a work function of not more than 5.0 eV.

12. A semiconductor device according to claim 11, wherein said first metal section consists of a metal (Me), said metal (Me) having a thermodynamic relationship with carbon (C) and a compound (MeC) of said metal and carbon, at a constant temperature under a constant pressure, of:

$$G_{Me}+G_C-10 \text{ (kcal/mol)} \geq G_{MeC},$$

where $G_{Me}$ is a Gibbs energy of said metal (Me), $G_C$ is a Gibbs energy of carbon (C) and $G_{MeC}$ is a Gibbs energy of said compound (MeC).

13. A semiconductor device according to claim 11, wherein said p-type semiconductor diamond is a boron-doped diamond which is formed via chemical vapor deposition.

* * * * *